United States Patent [19]
Lee

[11] Patent Number: 5,857,667
[45] Date of Patent: Jan. 12, 1999

[54] VACUUM CHUCK

[75] Inventor: Hyung-seok Lee, Seoul, Rep. of Korea

[73] Assignee: Samsung Aerospace Industries, Ltd., Kyongsangnam-do, Rep. of Korea

[21] Appl. No.: 738,049

[22] Filed: Oct. 25, 1996

[30] Foreign Application Priority Data

Oct. 27, 1995 [KR] Rep. of Korea ................ 98 37621

[51] Int. Cl.$^6$ ................................................ B25B 11/00
[52] U.S. Cl. ........................................................... 269/21
[58] Field of Search ................. 269/21, 20; 279/3 R; 294/64.1; 451/388; 248/362, 363

[56] References Cited

U.S. PATENT DOCUMENTS

| | | | |
|---|---|---|---|
| 2,317,348 | 4/1943 | Wekeman | 269/21 |
| 2,914,289 | 11/1959 | Schutt | 269/21 |
| 3,328,022 | 6/1967 | Miller | 269/21 |
| 3,729,206 | 4/1973 | Cacon et al. | 269/21 |
| 3,910,621 | 10/1975 | Hillier | 269/21 |
| 4,066,249 | 1/1978 | Huber et al. | 269/21 |
| 4,131,267 | 12/1978 | Ono et al. | 269/21 |
| 4,213,698 | 7/1980 | Firtion et al. | 269/21 |
| 4,721,462 | 1/1988 | Collins et al. | 269/21 |

*Primary Examiner*—Robert C. Watson
*Attorney, Agent, or Firm*—Finnegan, Henderson, Farabow, Garrett & Dunner, L.L.P.

[57] ABSTRACT

A vacuum chuck according to the present invention includes a base plate having an outer wall formed in a predetermined height around the base plate. In addition, at least one inner wall, having the same height as the outer wall, is formed on the base plate so as to divide the space surrounded by the outer wall into a plurality of compartments. A plurality of vacuum holes are provided in the respective compartments and connected to a vacuum source. By using the vacuum chuck according to the present invention, variously sized parts can be fixed to the vacuum chuck by making the compartments of the vacuum chuck in various sizes.

6 Claims, 6 Drawing Sheets

14a

14b

VACUUM CHUCK

BACKGROUND OF THE INVENTION

1. Field of the Invention

The present invention relates to a vacuum chuck. In particular, the present invention relates to a vacuum chuck used in an exposure apparatus.

2. Description of the Related Art

During the fabrication of an LCD, an exposure process is performed for forming an electric circuit pattern on a flat glass panel used in the LCD. In general, the exposure process includes a first step in which a photoresist is coated onto the flat glass panel. The photoresist has a photosensitivity to light of a specific wavelength. The photoresist is then exposed to light after a reticle, on which an electric circuit pattern is formed, is placed on the coated, flat glass panel.

An exposure apparatus for an LCD, used in the above exposure process, comprises a reticle stage for loading a reticle on which a circuit pattern is formed. The apparatus also includes a movable plate stage for absorbing and fixing the flat glass panel. Lenses are then arranged between the reticle and movable plate stages in order to focus light received from an exposure light source. In addition, a device such as a blinder is installed in the flat glass panel for illuminating the light through the reticle.

In the above exposure apparatus, the plate stage has a vacuum chuck for holding the flat glass panel. The vacuum chuck keeps the flat glass panel level by holding it with a vacuum. In other words, the vacuum keeps the flat glass panel from moving even when the plate stage is moved.

FIG. 1 illustrates a prior art exposure apparatus. In the exposure apparatus 10 of FIG. 1, a plate stage 12 is arranged to be movable on a base 11. On the upper portion of the plate stage 12 is installed a vacuum chuck 13. The vacuum chuck 13, in turn, holds a flat glass panel 14 for an LCD onto its upper portion.

The operation of the vacuum chuck 13 will be described with reference to FIGS. 2a and b. width and length of the vacuum chuck 13 is represented in the drawings by m and n, respectively. On the upper surface of the vacuum chuck 13, a plurality of bearing portions 22 are formed. These bearing portions 22 project to a predetermined height from the upper surface of the vacuum chuck 13, and act to prevent the glass panel 14 from being deformed by its weight when it is placed on the vacuum chuck 13. A side wall 23, having the same height as that of the projecting bearing portion 22, is formed around the vacuum chuck 13. The vacuum chuck 13 also has a plurality of vacuum holes 21 which are connected to an external vacuum source (not shown).

When the flat glass panel 14 is put on the vacuum chuck 13 in FIG. 2a, a sealed space is formed between the upper surface of the vacuum chuck 13, the lower surface of the flat glass panel 14, and the side wall 23. Thus, a vacuum is formed when the air in the sealed space is sucked through the vacuum holes 21 by the vacuum source. The vacuum, therefore, will fix the flat glass panel 14 onto the vacuum chuck 13. The above vacuum is illustrated in FIG. 2b, and is formed in the space marked by reference numeral 24.

The prior art vacuum chuck described above, however, has some problems. The most basic of these is that the size of the flat glass panel 14, which may be fixed by the vacuum chuck 13, is limited. In other words, the width and the length of the flat glass panel 14 must be the same as the width m and length n of the vacuum chuck 13. If the flat glass panel 14 is larger or smaller than the vacuum chuck 13, a vacuum cannot be formed in the space 24, and, therefore, the glass panel 14 cannot be fixed to the vacuum chuck 13. Thus, if the size of the flat glass panel 14 is changed (i.e., due to a consumer request, a change in plans, etc.), then the entire stage must be re-designed. Furthermore, even if the vacuum chuck 13 is the only part which needs to be changed, productivity will decrease and expenses will increase since much time is spent re-setting the exposure apparatus 10.

Therefore, it is an object of the present invention to provide a vacuum chuck which can hold differently sized parts through the use of a vacuum. Another object of the present invention is to provide a vacuum chuck having a plurality of compartments in which a vacuum can be independently formed in each compartment. It is still another object of the present invention to provide a vacuum chuck which can automatically control which compartments will have a vacuum and which will not.

SUMMARY OF THE INVENTION

Accordingly, the present invention is directed to a vacuum chuck that substantially obviates one or more of the problems due to limitations and disadvantages of the prior art.

To achieve the above objects and in accordance with the purpose of the invention, as embodied and broadly described, the vacuum chuck of the present invention includes a base plate and an outer wall. The outer wall has a predetermined height and is located around the base plate. Also included is at least one inner wall formed on the base plate so as to divide the space enclosed by the outer wall into a plurality of compartments. The at least one inner wall has the same height as the height of the outer wall. A plurality of vacuum holes are also provided in respective compartments of the plurality of compartments. Finally, a vacuum source is provided which connects to the plurality of vacuum holes.

According to one aspect of the present invention, the vacuum chuck further comprises a plurality of bearing portions formed in the plurality of compartments. Each of the bearing portions has the same height as that of the outer and inner walls.

According to another aspect of the present invention, the outer and inner walls of the vacuum chuck are arranged such that the plurality of compartments each have a rectangular shape.

According to yet another aspect of the present invention, the outer and inner walls of the vacuum chuck are arranged such that the plurality of compartments have either a circular or ring shape.

According to still another aspect of the present invention, the vacuum chuck further comprises a main controller which automatically controls the vacuum supply by activating a solenoid controlled valve. In addition, the plurality of compartments which are to receive the vacuum supply is manually selected.

BRIEF DESCRIPTION OF THE DRAWINGS

The accompanying drawings, which are incorporated in and constitute a part of the specification, illustrate embodiments of the invention and, together with the description, serve to explain the objects, advantages, and principles of the invention. In the drawings:

FIG. 2b is a partial sectional view taken along the line II—II of FIG. 2a;

FIG. 3b is a partial sectional view taken along the line III—III of FIG. 3a;

DETAILED DESCRIPTION OF THE INVENTION

Embodiments of the present invention will now be described with reference to the accompanying drawings.

Figure 1:
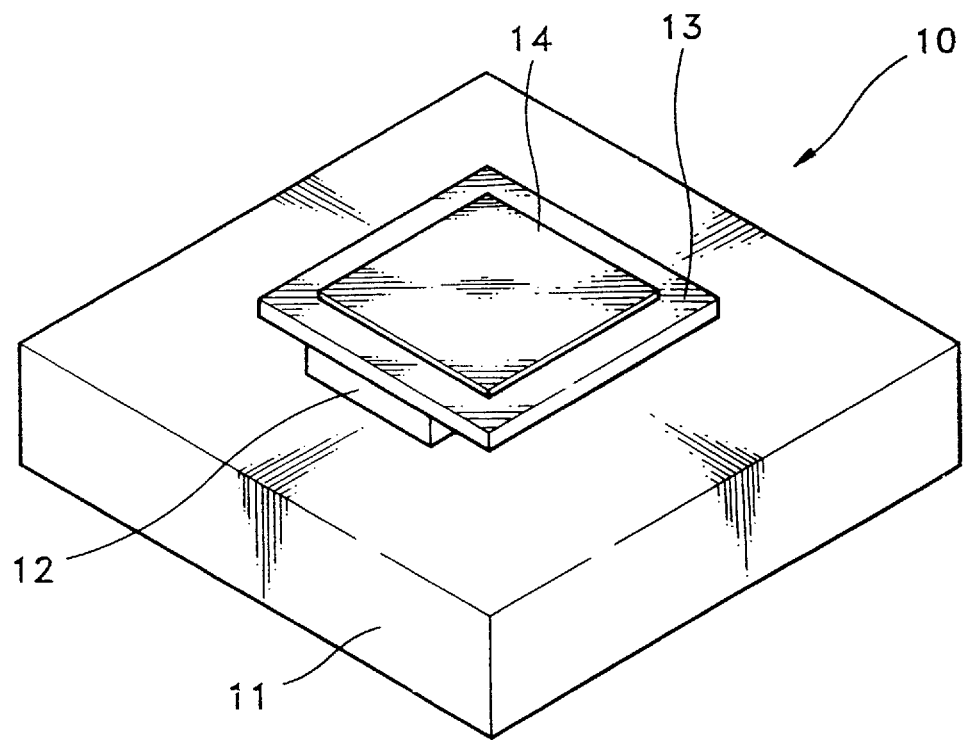
FIG. 1 is a perspective view of a prior art exposure apparatus.
Figure 2A:
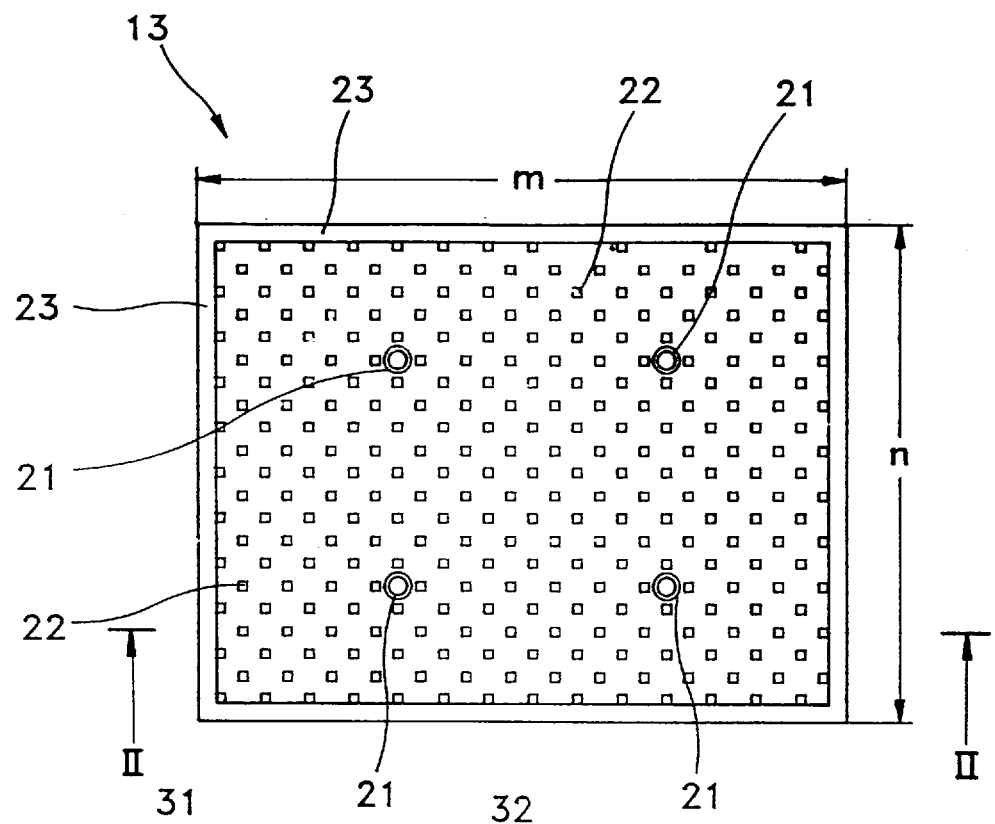
FIG. 2a is a plan view of a prior art vacuum chuck 13 shown in FIG. 1.
Figure 2B:
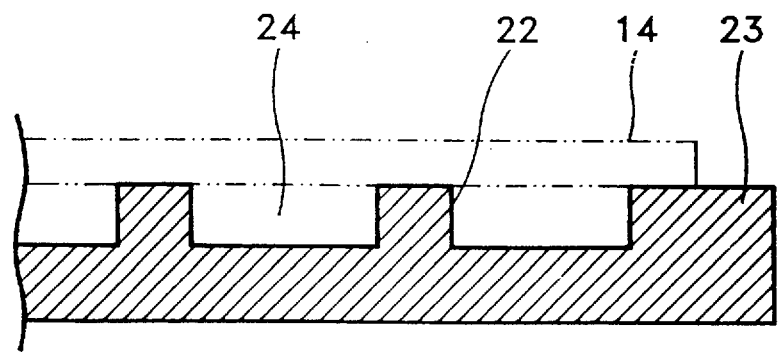
Figure 3A:
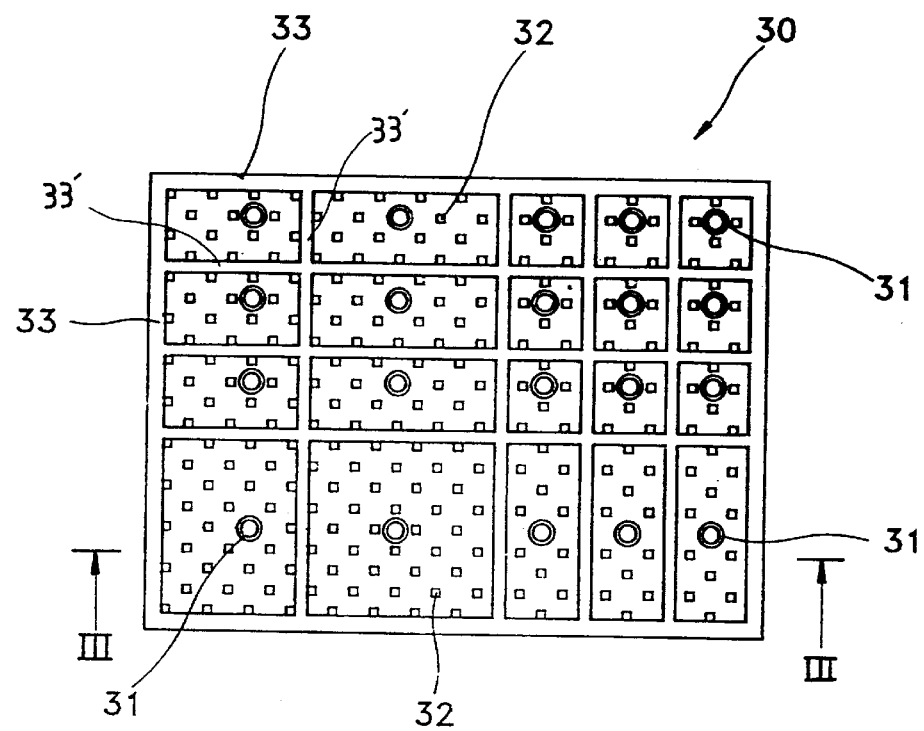
FIG. 3a is a plan view of a vacuum chuck according to an embodiment of the present invention.
Figure 3B:
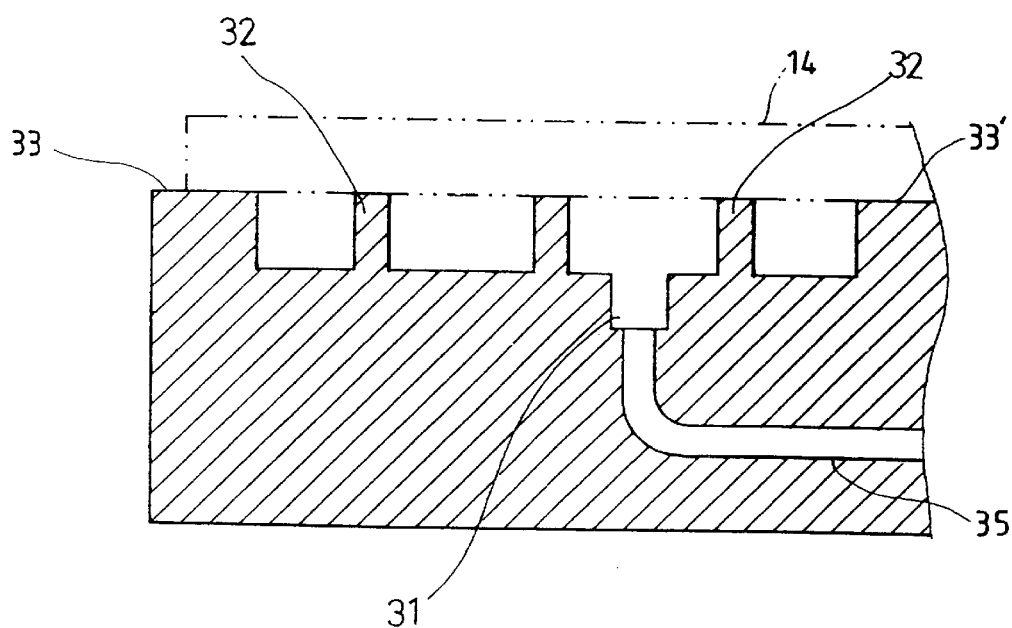

FIG. 3a illustrates a vacuum chuck 30 according to an embodiment of the present invention. The flat glass panel 14 is arranged on the upper surface of the vacuum chuck 30. As shown in FIGS. 3A and 3B, the vacuum chuck 30 is divided into a plurality of compartments by a plurality of inner walls 33'. For the case shown in FIG. 3A, twenty compartments are formed by the outer walls 33 and the inner walls 33'. This type of construction allows a designer to choose an area of the vacuum chuck's upper surface according to the size of a part.

Each of the compartments include respective bearing portions 32 and vacuum holes 31. The height of the bearing portions 32 is the same as that of the outer walls 33 and the inner walls 33', thereby preventing the flat glass panel 14 from deforming when it is placed on the vacuum chuck 30. By installing at least one vacuum hole 31 in each compartment, a vacuum may be independently formed in the compartments when other compartments are not covered by the flat glass panel 14.

FIG. 3B is a sectional view of the vacuum chuck 30 taken along the III—III line of FIG. 3A. The height of the outer walls 33 and the inner walls 33' is the same as that of the bearing portions 32. In addition, the vacuum holes 31 are formed on the bottom surface and are connected to an external vacuum source 44 (refer to FIG. 4) through a vacuum pipe 35.

Figure 4:
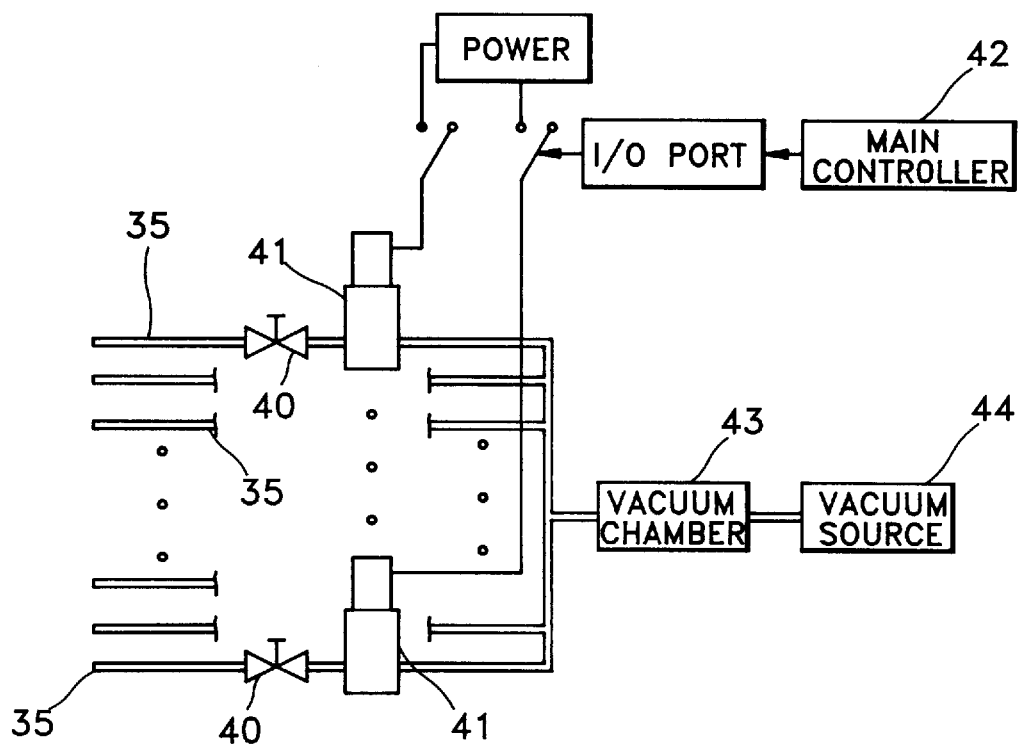
FIG. 4 is a diagram of a vacuum supply piping for the apparatus of FIGS. 3a and 3b.

FIG. 4 shows a vacuum piping for supplying a vacuum to a vacuum chuck of the present invention. One end of the vacuum pipe 35 is connected to the respective vacuum holes 31. The other end of the vacuum pipe 35 is connected, through a solenoid valve 41, to a vacuum chamber 43 and vacuum source 44. The solenoid valve 41 can be either manually controlled or automatically controlled by an electric signal from a main controller 42. For manual control, the compartments which are to receive the vacuum supply are manually selected by, for example, opening and closing a manual valve 40. For automatic control, the entire supply of vacuum can be automatically controlled by controlling the solenoid valves 41 according to the size of a part to be fixed to the vacuum chuck. In either case, the main controller 42 may automatically control the vacuum supply to the manually or automatically selected compartments by activating the corresponding solenoid controlled valves 41. In other words, for specific compartments of the vacuum chuck which are not covered by the flat glass panel 14, their corresponding valves 41 will be closed. For other compartments which are covered by the flat glass panel, their corresponding solenoid valves 41 will be intermittently opened and closed.

Figure 5:
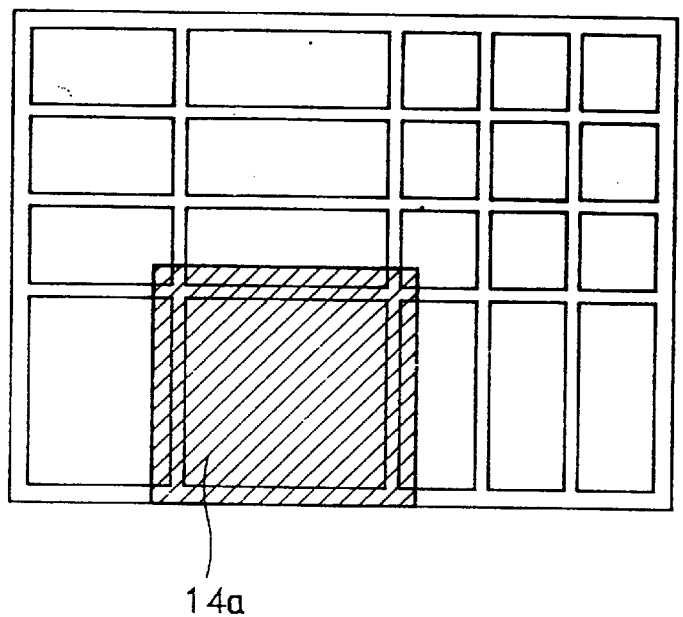
FIGS. 5 and 6 are plan views showing the state of using the vacuum chuck of the present invention.
Figure 6:
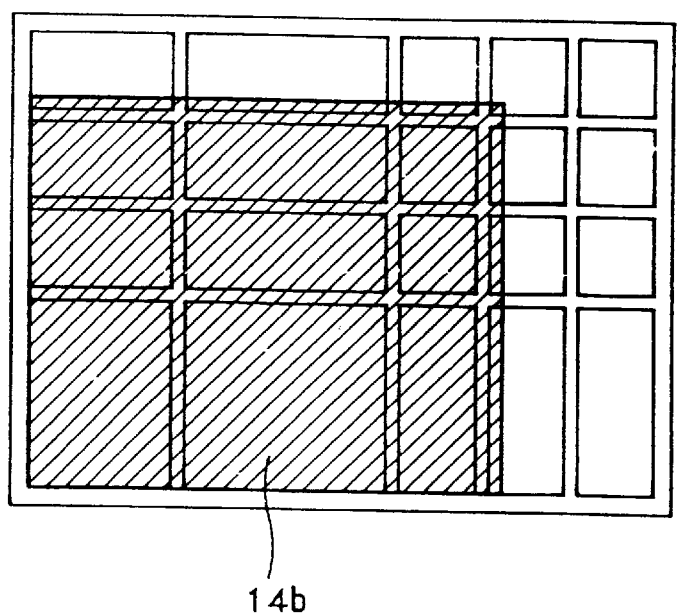

In FIGS. 5 and 6, an example of fixing the flat glass panels 14a and 14b to the vacuum chuck according to the present invention is shown. In FIG. 5, a flat glass panel 14a can be fixed since it is only a little larger than the largest compartment of the vacuum chuck. Therefore, the flat glass panel 14a is fixed to the vacuum chuck by operating the solenoid valve 41 to supply vacuum to only the largest compartment of the vacuum chuck. For the case shown in FIG. 6, on the other hand, the size of the flat glass panel 14b corresponds to 9 compartments. Thus, the vacuum is supplied to these 9 compartments and is cut off to the other 11 compartments of the vacuum chuck.

Even though the vacuum chuck of the present invention has been described for fixing a rectangular, flat glass panels 14a and 14b to an LCD, the present invention is not limited to this embodiment. For example, as shown in FIGS. 7a and 7b, a circular semiconductor wafer can be fixed to a vacuum chuck of the present invention.

Figure 7A:
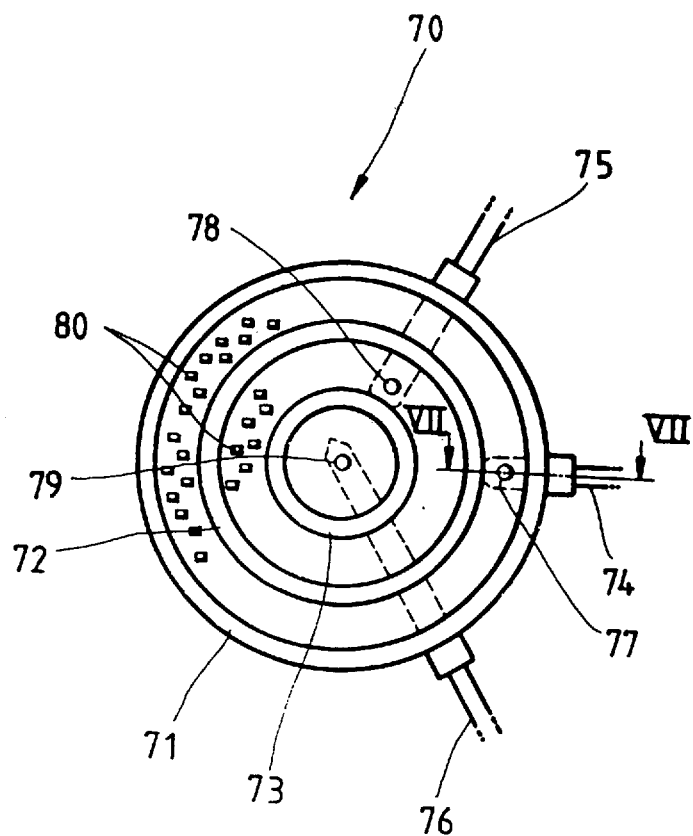
FIGS. 7a and 7b are a plan view and a sectional view, respectively, of a vacuum chuck according to another embodiment of the present invention.

Referring to FIGS. 7a and 7a, the vacuum chuck for fixing a semiconductor wafer is preferably circular since these wafers generally have a circular shape. In a vacuum chuck 70 shown in FIG. 7a, compartments are formed by arranging concentric circular walls 71, 72, and 73, each having a different diameter. Thus, the outer compartments will be ring-shaped, while the center compartment will have a circular shape. Each of these compartments includes respective vacuum holes 77, 78, and 79. The vacuum is supplied to the vacuum holes 77, 78, and 79 through vacuum pipes 74, 75, and 76, which are installed in a radial direction. Furthermore, bearing portions 80 are formed in each of the respective compartments.

Figure 7B:
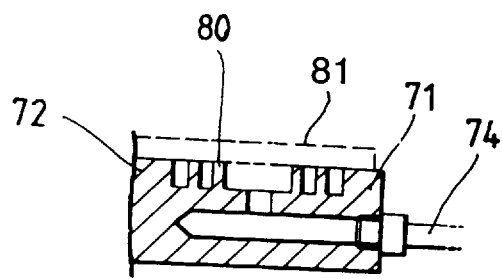

FIG. 7b is a sectional view taken along VII—VII line of FIG. 7a. As shown in FIG. 7b, the height of the bearing portions 80 is the same as that of the circular walls 71 and 72 forming one of the outer ring-shaped compartments. The wafer 81 is prevented from being deformed by being arranged on the bearing portions 80 and the side walls 71 and 72, each having the same height.

According to the vacuum chuck of the present invention, variously sized parts can be fixed onto the vacuum chuck by arranging the compartments of the vacuum chuck into various sizes. Also, since it is possible to automatically control the vacuum to the respective compartments by a main controller, the vacuum chuck can be easily used regardless of the part's size.

It will be apparent to those skilled in the art that various modifications and variations can be made to the vacuum chuck of the present invention without departing from the spirit or scope of the invention. Thus, it is intended that the present invention cover the modifications and variations of this invention provided they come within the scope of the appended claims and their equivalents.

What is claimed is:

1. A vacuum chuck comprising:

a base plate;

an outer wall located around the base plate and having a predetermined height;

at least one inner wall formed on the base plate so as to divide the space enclosed by the outer wall into a plurality of compartments, wherein the at least one inner wall has the same height as the height of the outer wall;

a plurality of vacuum holes formed on the base plate, each vacuum hole provided in a respective one of the plurality of compartments;

a vacuum source connected to the plurality of vacuum holes;

plurality of bearing portions formed in the plurality of compartments and having the same height as that of the outer and inner walls;

a main controller which automatically controls the vacuum supply by activating a solenoid controlled valve; and means for manually selecting the plurality of compartments which are to receive the vacuum supply.

2. A vacuum chuck as claimed in claim 1, wherein said outer and inner walls are arranged such that the plurality of compartments each have a rectangular shape.

3. A vacuum chuck as claimed in claim 1, wherein said outer and inner walls are arranged such that the plurality of compartments have either a circular shape or a ring shape.

4. A vacuum chuck as claimed in claim 1, wherein the main controller activates a plurality of solenoid controlled valves, each valve corresponding to one of the plurality of compartments, according to the size of a part to be fixed to the vacuum chuck.

5. A vacuum chuck as claimed in claim 2, wherein the main controller activates a plurality of solenoid controlled valves, each valve corresponding to one of the plurality of compartments, according to the size of a part to be fixed to the vacuum chuck.

6. A vacuum chuck as claimed in claim 3, wherein the main controller activates a plurality of solenoid controlled valves, each valve corresponding to one of the plurality of compartments, according to the size of a part to be fixed to the vacuum chuck.

* * * * *